United States Patent [19]

Karapiperis et al.

[11] Patent Number: 5,294,564
[45] Date of Patent: Mar. 15, 1994

[54] METHOD FOR THE DIRECTED MODULATION OF THE COMPOSITION OR DOPING OF SEMICONDUCTORS, NOTABLY FOR THE MAKING OF PLANAR TYPE MONOLITHIC ELECTRONIC COMPONENTS, USE OF THE METHOD AND CORRESPONDING PRODUCTS

[75] Inventors: Leonidas Karapiperis, Bourg la Reine; Didier Pribat, Paris, both of France

[73] Assignee: Thomson-CSF, Puteaux, France

[21] Appl. No.: 28,607

[22] Filed: Mar. 8, 1993

Related U.S. Application Data

[63] Continuation of Ser. No. 496,965, Mar. 21, 1990, abandoned.

[30] Foreign Application Priority Data

Mar. 31, 1989 [FR] France .............. 89 04257

[51] Int. Cl.$^5$ ........................... H01L 21/205
[52] U.S. Cl. ................. 437/81; 148/DIG. 26; 148/DIG. 41; 437/89; 437/90; 437/108; 437/110; 437/126; 437/133; 437/976
[58] Field of Search ............ 437/62, 67, 69, 72, 437/80, 81, 83, 89, 90, 99, 108, 110, 126, 133, 915, 976; 148/DIG. 25, DIG. 26, DIG. 41, DIG. 50, DIG. 56, DIG. 65, DIG. 72, DIG. 95, DIG. 110, DIG. 119, DIG. 160, DIG. 169; 156/610-613

[56] References Cited

U.S. PATENT DOCUMENTS

| | | | |
|---|---|---|---|
| 4,131,984 | 1/1979 | Kaplow et al. | 437/90 |
| 4,725,112 | 2/1988 | Bridges et al. | 350/96.12 |
| 4,789,643 | 12/1988 | Kijikawa | 437/81 |
| 4,824,794 | 4/1989 | Tabata et al. | 437/89 |
| 4,837,182 | 6/1989 | Bozler et al. | 437/89 |
| 4,952,526 | 8/1990 | Pribat et al. | 437/90 |

FOREIGN PATENT DOCUMENTS

| | | |
|---|---|---|
| 0336830 | 10/1989 | European Pat. Off. . |
| 3022565 | 1/1981 | Fed. Rep. of Germany . |
| 0061031 | 4/1984 | Japan ............ 437/89 |
| 0174366 | 7/1988 | Japan ............ 437/89 |

OTHER PUBLICATIONS

Gallium Arsenide and Related Compounds, 1986, (Proceedings of the Thirteenth International Symposium), pp. 1-8, H. Watanabe et al., "Atomic Layer Epitaxy".
Applied Physics Letters, vol. 51, Nov. 9, 1987, pp. 1518-1520, H. Asai et al., "Narrow Two-Dimensional Electron Gas Channels In GaAs/AlGaAs Sidewall Interfaces By Selective Growth".
Japanese Journal of Applied Physics, vol. 24, No. 12, Dec. 1985, pp. 1666-1671, K. Yamaguchi et al., "Selective Epitaxial Growth of GaAs By Metalorganic Chemical Vapor Deposition".

*Primary Examiner*—Mary Wilczewski
*Attorney, Agent, or Firm*—Oblon, Spivak, McClelland, Maier & Neustadt

[57] ABSTRACT

The invention pertains to the field of fabrication, by vapor phase deposition, of the thin layers of monocrystalline, polycrystalline or amorphous material on a substrate having an identical or different nature. The aim is to provide a method, enabling this structure to be made, that includes a modulation of both the composition and the doping, in a direction that is not perpendicular to the surface of the substrate, notably in a lateral way to obtain a planar technology. According to the invention, this thin layer is made by conformal epitaxy, using a crystalline seed in gas phase, between two confinement layers made of a distinct material in such a way that there can be neither nucleation nor deposition of semiconductive material on the surfaces of said confinement layers and wherein the variation of the gaseous mixture of said gas phase is controlled to obtain said modulation of the composition and/or of the doping of said thin film.

30 Claims, 11 Drawing Sheets

STEPS 1-2

STEPS 3-4

STEP 5

STEPS 6

STEPS 7-8

STEPS 9-10

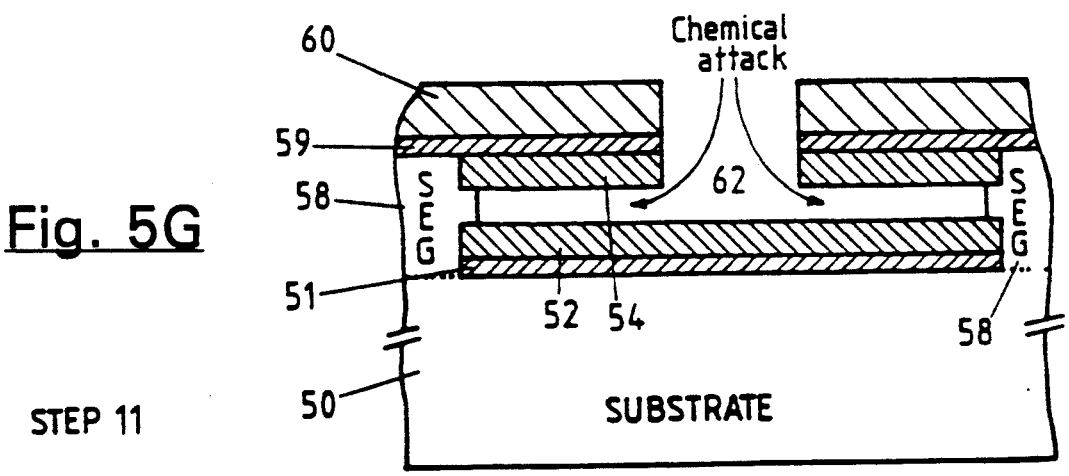
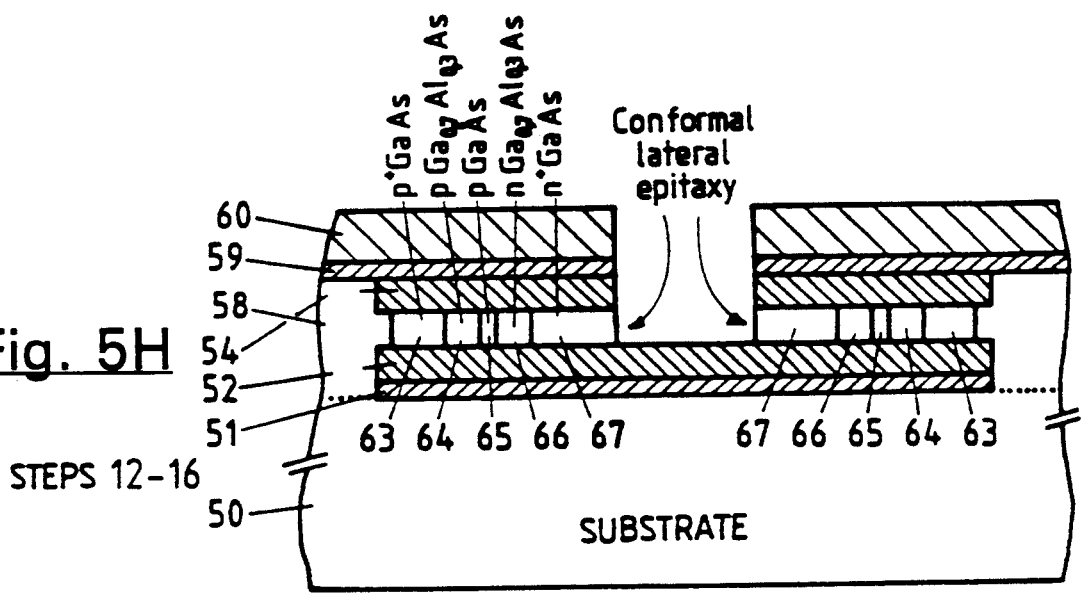
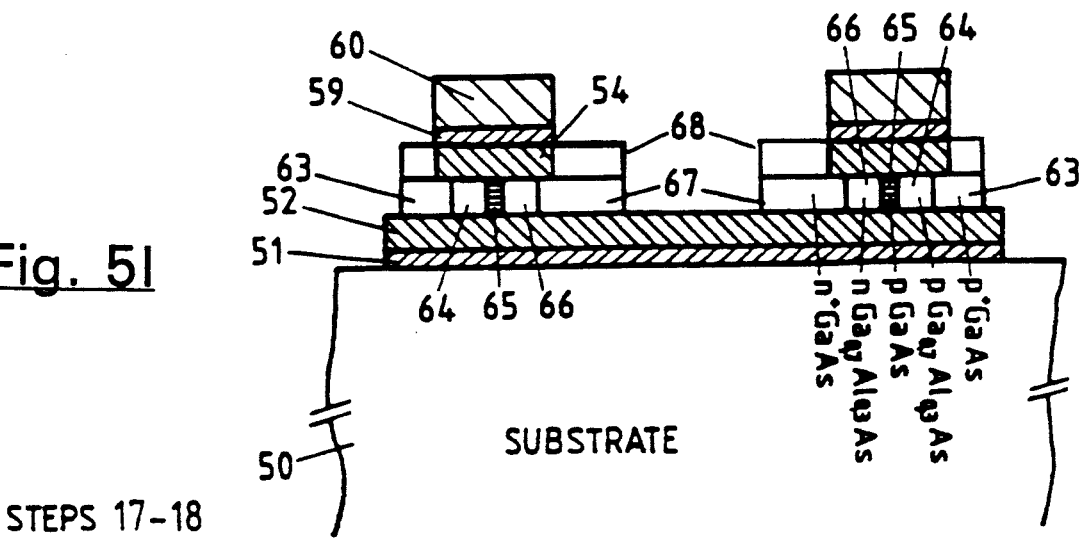

STEP 5

STEPS 12-14

STEPS 15-16

STEP 1

STEP 2

STEP 3

STEP 4

STEPS 5-6

STEP 7

METHOD FOR THE DIRECTED MODULATION OF THE COMPOSITION OR DOPING OF SEMICONDUCTORS, NOTABLY FOR THE MAKING OF PLANAR TYPE MONOLITHIC ELECTRONIC COMPONENTS, USE OF THE METHOD AND CORRESPONDING PRODUCTS

This application is a continuation of application Ser. No. 07/496,965, filed on Mar. 21, 1990, now abandoned.

BACKGROUND OF THE INVENTION

1. Field of the Invention

The invention pertains to the fabrication, by vapor phase deposition, of thin layers or films of a monocrystalline, polycrystalline or amorphous material on a substrate having an identical or different nature.

The invention also covers the making of monolithic electronic components, notably in integrated circuits (ICs), by means of a method such as this for the fabrication of thin layers.

The method described according to the invention particularly makes it possible to achieve a controlled variation in the composition and/or doping profiles of such layers in a way that is directed, notably in a lateral direction parallel to the surface of the substrate, unlike in usual techniques of epitaxy or of doping which create profiles of modulation in the composition or doping that vary essentially in a direction that is perpendicular to the surface of the substrate.

2. Description of the Prior Art

More precisely, in the field of micro-electronics and III-V semiconductors in particular, a basic method in the fabrication of discrete devices or of integrated circuits consists in the obtaining, by epitaxial growth, of layers doped at different levels on semiconductor substrates. Several methods of epitaxy are known such as, notably, vapour phase epitaxy (VPE) and its variants such as,, notably, metalorganic chemical vapor deposition (MOCVD) or molecular beam epitaxy (MBE). In current practice, a common feature of all these methods is that the composition profile achieved during one and the same deposition is uniform in a given plane parallel to the surface of the substrate and can vary only in a direction perpendicular to the surface of the substrate. This is sufficient, and even indispensable, in most cases in the planar technology of ICs. There are, however, cases where it would be advantageous to be able to cause variation in the composition profile of active zones of devices in a direction parallel to the plane of the surface of the substrate.

A typical example is the making of a planar laser wherein the composition of the various layers varies in a direction parallel to the plane of the semiconductor surface. FIG. 1A shows the drawing of a simple laser made of GaAlAs/GaAs/GaAlAs, obtained in a known way by growth perpendicular to the plane of the substrate 10. FIG. 1B shows the arrangement of the layers of a planar laser having a direction of growth that is parallel to the plane of the substrate 10, and having a structure which has, therefore, been rotated by 90° with respect to the known laser of FIG. 1A.

Now, up till the present time, there has been no method for making the structure of FIG. 1B.

A first aim of the invention is to provide a method for the fabrication of devices with directed modulation of the composition profile and, notably, of a planar laser such as this.

In the field of micro-electronics today, another basic method in the making of discrete devices or integrated circuits consists in the defining of active zones in the semiconductor substrate by doping. Several doping methods are known, notably ion implantation, vapor phase epitaxy or thermal diffusion. In current practice, a common feature of all these methods is that the doping profile achieved during one and the same step is uniform in a given plane parallel to the surface of the substrate. This is sufficient, and even indispensable, in most cases in the planar technology of ICs. There are, however, cases where it would be advantageous to be able to make the doping profile of an active zone vary in a direction parallel to the plane of the surface of the substrate, for example making a hyperabrupt plane varicap diode with laterally graduated doping profile as shown in FIGS. 2 and 3.

A known method to create laterally variable doping profiles is provided by focused ion beams. This approach enables implantation without mask with a lateral resolution of the order of 0.1 $\mu M$ (see J. Melngaisis, J. Vac. Sci. Technol., B5(2), 469, 1987, on the technology and applications of focused beams). Several published patent documents are based on this idea (see inter alia the French publications 8518985, 8518984 and 8519494). This approach is an attractive one but suffers from a major drawback, related to the low current of emission of the ion sources: the very slow writing speed. Moreover, it calls for the use of focused ion beam machines which are at a stage of development that is still, substantially, prior to that of industrial application. Furthermore, a thermal annealing step for the activation of the dopants is needed, as in the case of standard ion implantation.

A second aim of the invention is to provide a method for the directed (notably lateral) modulation of the doping profile, according to a fairly simple principle, with a high lateral definition, this method being above all capable of being performed with means commonly used in the micro-electronics industry (FIG. 3).

Finally, it is also possible to consider applications where there is need for a modulation of both the doping profile and the composition profile. Devices such as this have already been proposed in the literature on the subject. These devices are for example, Gunn oscillators with (Al:Ga)As heterojunction cathode (see A. Al-Omar et al, Proceedings IEEE/Cornell Conference on Advanced Concepts in High Speed Semiconductors Devices and Circuits in High Speed Semiconductor Devices and Circuits, August 1987, p. 365). A structure such as this is shown in FIGS. 4B, 4C facing a conventional Gunn diode with two abrupt fronts 34, 35 of the doping profile 36, for comparison (FIG. 4A). The known structure of FIGS. 4B and 4C is a "vertical" structure, namely a structure for which the doping profile 31 and composition profile 32 (note the graduated modulation 33 of the profile 32 on the cathode side) vary in a direction perpendicular to the plane of the substrate.

A third essential aim of the invention is therefore a method enabling the making of this structure with a modulation of both the composition and the doping, in a direction that is not perpendicular to the surface of the substrate, notably in a lateral way to obtain a planar type of technology and to be capable of integrating this device into a circuit.

With respect to the above example, it must be emphasized that the invention makes it possible to achieve laterally graduated doping and/or composition profiles as well as the lateral high definition required by this device.

SUMMARY OF THE INVENTION

These aims, as well as others which shall appear further below, are achieved by means of a method for making a thin layer formed by at least one monocrystalline semiconductor material with modulation of the composition and/or of the doping of said layer, according to which said thin layer is made by conformal selective epitaxy initiated on a monocrystalline seed, using a gas phase, between two confinement layers made of material distinct from the semiconductor, in such a way that there can be neither nucleation nor deposition of semiconductor material on the surfaces of said confinement layers, wherein the variation of the composition of the gas mixture of said gas phase is controlled to obtain said modulation of the composition and/or of the doping of said thin layer.

According to a first mode of preparation, to obtain a thin layer formed by at least two distinct monocrystalline semiconductor materials, the modulation of the composition of said layer is obtained by the controlled and checked modification, in said gas mixture, of the partial pressure and/or of the mole fraction of the useful gases used to create the solid deposition of monocrystalline semiconductor materials while, at the same time, maintaining the selectivity of the deposition.

According to a second mode of preparation, for the making of a thin layer formed by at least one monocrystalline semiconductor material with modulation of the doping in said layer, said modulation is controlled by variation in said gas mixture of the partial pressure and/or the mole fraction of the dopant gases while, at the same time, maintaining the selectivity of the deposition.

Advantageously, the epitaxial technique used is one of selective epitaxy, of the type belonging to the group including, notably, CVD, MOCVD and the VPE method using chlorides, at atmospheric or reduced pressure.

According to an essential characteristic of the invention, said conformal epitaxy is done in a lateral cavity of confinement made from a stratified dielectric/temporary layer/dielectric structure deposited on a monocrystalline substrate, according to the method described in the prior art patent documents 88 04 437 and 88 04 438, as described in detail further below.

Advantageously, but not restrictively, the temporary layer may be made of amorphous or polycrystalline silicon, $SiO_2$ or of the polycrystalline variety of material that acts as a monocrystalline seed, and from which the conformal epitaxy is initiated. The invention also concerns the use of the method, notably for the making of a laser diode or photo-detector made of a direct gap semiconductor (for example, AsGa, InP, quaternary elements or other), a planar Gunn diode with heterojunction cathode and a planar Schottky diode with variable capacitance and hyperabrupt profile. These examples are not restrictive. The invention also concerns the thin layers and electronic components made according to the method.

BRIEF DESCRIPTION OF THE DRAWINGS

Other characteristics and advantages of the invention will appear from the following description of preferred modes of preparation for the implementation of the method of the invention, notably for the making of specific components with lateral modulation of the doping or of the composition, and from the appended drawings, wherein:

FIGS. 5A to 5I gives a schematic view of the successive steps of a mode of implementation of the method of the invention for making the planar laser of FIG. 1B;

DETAILED DESCRIPTION OF THE INVENTION

Figure 1A:
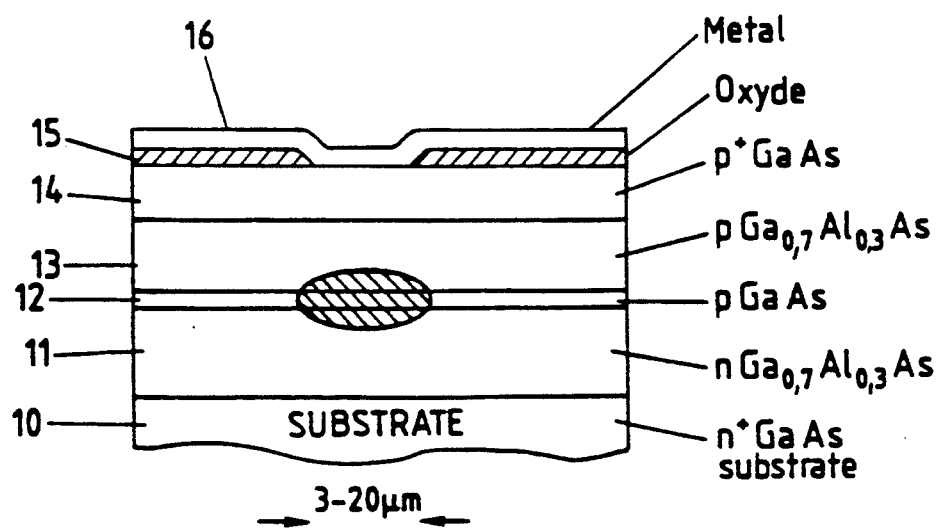
FIG. 1A shows a simple laser made of GaAlAS/GaAs/GaAlAs obtained in a known way by growth perpendicular to the plane of the substrate.

The method of the invention is aimed at enabling a directed modulation, notably in the lateral direction parallel to the plane of the substrate, of the composition and/or of the doping, during the formation, from a vapor phase, of the thin layers of a polycrystalline or amorphous but, preferably monocrystalline, material.

The implementation of the method of the invention relies essentially on the methods used to make an alternation of layers of monocrystalline semiconductive materials and layers of insulating materials, such as those described in the French patent documents Nos. 8804437 and 8804438.

The method described in the patent document 8804477 concerns the preparation, by growth from a vapor phase, of a monocrystalline thin layer of a semiconductor material, wherein the growth is initiated on a seed of a monocrystalline material of the same type as the semiconductor material of the thin layer to be obtained, and is confined between two layers of material that is distinct from the semiconductor material in such a way that there can be neither nucleation nor deposition of the semiconductor material on the exposed surfaces of this distinct material or these distinct materials, the interval between the two layers of the distinct material or materials defining the thickness of the monocrystalline thin layer to be obtained.

As illustrated in FIGS. 8A to 8D, a first mode of preparation which is a non-restrictive illustration of this method of preparing a layer of monocrystalline, semiconductor material on a first layer of an insulator material 802 made on a monocrystalline, semiconductor substrate 801, comprises the following steps:

a first step for the making, on the monocrystalline, semiconductor substrate, of said first layer of insulating material 802 having a selectivity of chemical attack with respect to the underlying semiconductor and enabling neither nucleation nor deposition from the species of said vapor phase on its surface exposed to the vapor phase;

a second step for the etching of first apertures 823, 824 in the first layer 802 of insulating material:

a third step for the making, in the first apertures 823, 824 and on the parts of the insulating layer 820, 821, 822, remaining after the previous etching step, of a layer of a semiconductor material 830 to 834, this layer being monocrystalline in the apertures 823, 824 and polycrystalline on the insulator 820, 821, 822;

a fourth step for the making of a second layer 804 of an insulator material on the layer of semiconductor material 830 to 834;

a fifth step for the etching, in the second layer 804 of insulator material, of at least one second aperture 843, 844 ending on a polycrystalline part 830, 831, 832 of the layer of semiconductor material 830 to 834;

a sixth step for the chemical attacking of the polycrystalline semiconductor material 830, 831, 832 so as to eliminate all the polycrystalline, semiconductor material and, if necessary, so as to slightly attack the monocrystalline material.

In the method described, the bared cavities 830, 831, 832 are used for the directed growth, in vapor phase, of a monocrystalline, semiconductor material. As shall be seen here below, according to the method of the present invention, these same cavities 830, 831, 832 will be used to achieve a directed epitaxial growth of a crystalline material with controlled modulation of the composition and/or of the doping of the material.

FIGS. 9A to 9D give a schematic view of a second variant for the making of the cavities, also described in the French patent document No. 8804437.

Figure 9A:
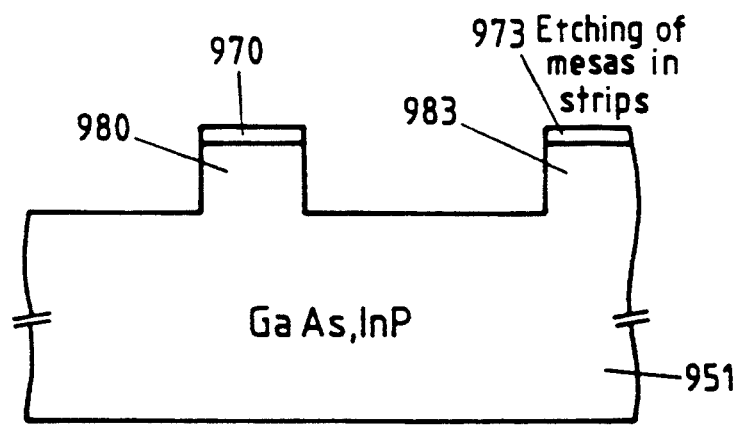
FIGS. 9A to 9D summarize the main steps of a second mode of implementation of the method described in the French patent No. 8804437 for the making of cavities for directed epitaxial growth.
Figure 9B:
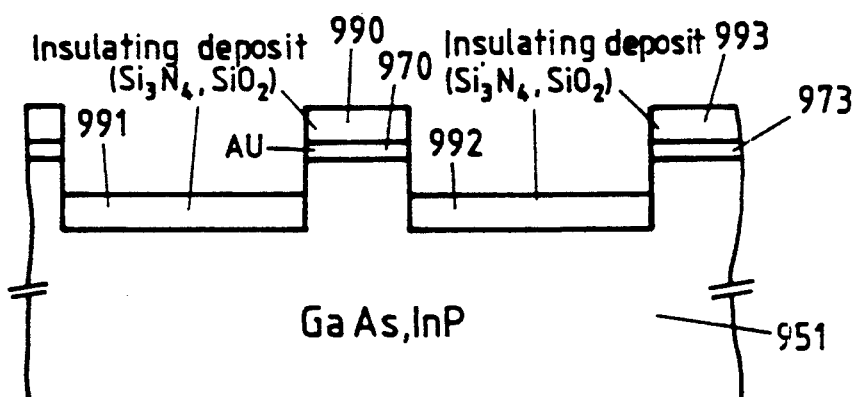
Figure 9C:
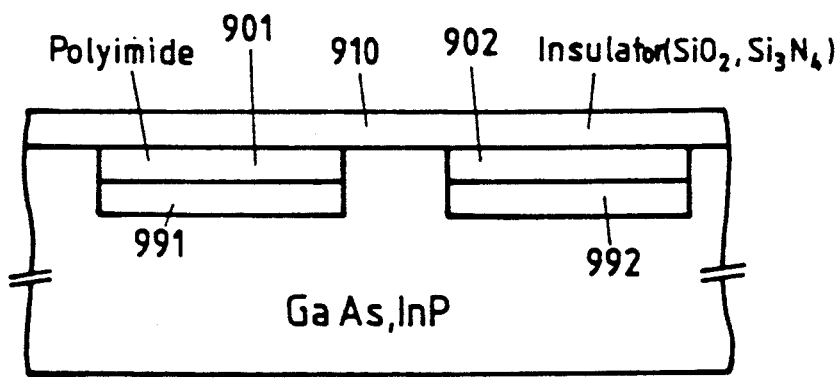
Figure 9D:
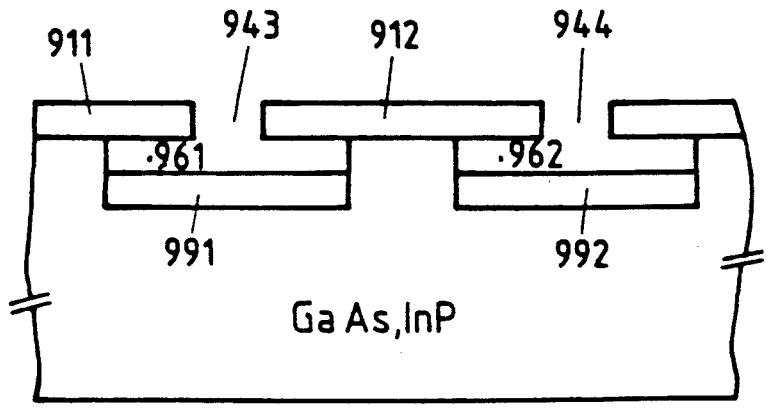

According to this variant, the following steps are undertaken:

a first step for making mesas 980, 983 in strips of a determined height in a monocrystalline semiconductor substrate 951, for example by the chemical attacking of the substrate 951 after masking 970, 973 (FIG. 9A).

a second step for the deposition, on the substrate between the mesas 980, of a dielectric material 991, 992 with a thickness smaller than the height of the mesas (FIG. 9B), the dielectric layers 990, 993 and the masking layers 970, 973 deposited on the mesas being then removed by a "lift off" operation;

a third stage for the deposition, on the dielectric material 991, 992, of an organic type of interposed material 901, 902 having a selectivity of chemical attack with respect to the dielectrical material 990, 991, 992 and to the layer 910 of upper material which will be deposited subsequently, the thickness of which is such that its addition to the thickness of the dielectric material 991, 992 enables the height of the mesas to be equalled (FIG. 9C);

A fourth step for the deposition, on all the mesas 980, 983 and on the entire interposed material 901, 902, of a layer 910 of an encapsulating material having a selectivity of chemical attack with respect to the layer of organic material and permitting neither nucleation nor deposition from the species of said vapor phase on the exposed surfaces of said encapsulating material (FIG. 9C);

A fifth step for the making of apertures 943, 944 in the layer 910 of encapsulating material in zones reaching the interposed material 901, 902 (FIG. 9D);

a sixth step for the removal, by the apertures 943, 944, of the interposed material 901, 902 (FIG. 9D).

The cavities 961, 962 thus bared will serve for the directed, epitaxial growth of the method of the present invention, with modulation of the composition and/or of the doping of semiconductors.

Other modes of preparation of the cavities 830, 831, 832; 961, 962 may be envisaged by those skilled in the art, and they are described in the documents Nos. 88 04437 and 88 04438.

The French patent document No. 8804438, for its part, describes a method making it possible to block the propagation of defects appearing during the growth of a heteroeptiaxial structure of a monocrystalline material, notably defects inherent in the mode of growth, defects created by the stresses under which the deposit is placed during cooling, and other defects due to other causes.

The method consists in the interposing, on the path of growth of the thin layer crystal to be obtained, of a contraction which will block the growth of the defects.

Figure 10:
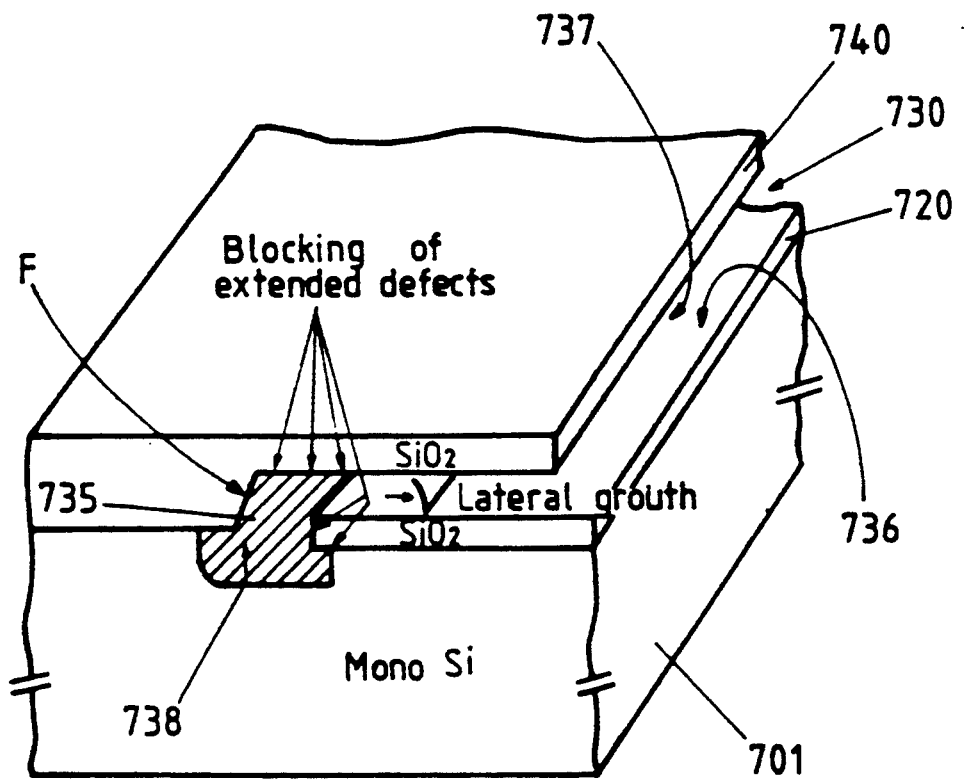
FIG. 10 gives a schematic view of the principle of the "trap for heteroepitaxial growth defects" as described in the French patent No. 8804438.

FIG. 10 gives a simplified illustration of the basic method of the invention. According to this method, a structure is made, comprising essentially a space 730 demarcated by the faces 736 and 737 of two layers 720 and 740. The two layers 720 and 740 are made of a material on which, given the conditions of deposition used, no deposit of the semiconductor material to be grown is observed. In the bottom of the space 730, there is located a portion or seed 738 of a semiconductor material (for example the substrate). More precisely, according to the example of preparation shown, the layers 720 and 740 are made on a substrate 701. The seed 738 is then a part of the substrate 701 located beneath the plane of the surface 736 of the layer 720.

Under these conditions, a selective epitaxy of a semiconductor material made in the space 730 gives rise to a monocrystalline growth of the semiconductor material on the seed 738. This growth progresses perpendicularly to the plane of the seed 738 (vertically) until it fills the cavity 735, then progresses laterally (horizontally) in the space 730.

If the epitaxiated semiconductor material is different from the material of the substrate 701, it is seen that the epitaxial growth occurs first of all vertically in the cavity 735 and then laterally between the dielectric strips 720 and 740. Thus, the defects created during the vertical growth (heteroepitaxy) step are blocked by the dielectric layers 720 and 740, during the lateral growth step. Furthermore, no new defects are created during this same step of lateral growth for the method has become homoepitaxial during the lateral growth; the defects, once blocked, thus disappear definitively from the thin layer. The cavity 735 actually represents a defect trap.

It will be noted, however, that the growth of the crystal in all cases can be done laterally only if conditions can be set up such that there is no deposition, on the surfaces 736 and 737, of the confinement layers 720 and 740. The same should be the case for the surfaces of the layers 802 and 804, as well as 991, 992 and 910. This is achieved under conditions of selective deposition, that is, notably by the choice of the materials present, and the adjustment of the reaction temperature and of the respective partial pressures of the constituent elements of the gas phase.

We shall now present illustrations of modes of implementing the invention. These modes of implementation pertain, respectively, to a lateral modulation of the composition of a thin layer made of a monocrystalline material, in a first stage, and to the lateral modulation of the doping of a thin layer made of monocrystalline material, in a second stage.

LATERAL MODULATION OF THE COMPOSITION

This mode of preparation according to the method of the invention may be applied with practically all the semiconductors used today in the micro-electronics industry (III-V, silicon compounds, II-VI compounds etc.). The typical semiconductors for the active zone of the laser device that shall be considered herein by way of a non-restrictive illustration are GaAS and the ternary compounds of the GaAlAs type. In general, with respect to the laser compounds, the invention can be applied to III-V type (GaAs, InP type as well as their different ternary or quaternary derivatives) direct gap semiconductors. A "direct gap semiconductor" is any semiconductor wherein the electron transitions between the valence band and the conduction band occur with the transmission or absorption of a photon.

As regards the starting substrate, two examples may be considered:

a. Si Substrate, as a typical (but non-restrictive) case of heteroepitaxy, and b. GaAs substrate.

In the first case, every necessary precaution must be taken to block the lateral propagation of the defects caused by the lattice mismatching between GaAs and Si, the difference between their constants of thermal expansion and the different natures (pole and non-pole) of the two semiconductors. This is shown schematically in FIG. 10. According to the type of defects shown, a second step of lateral epitaxy may be necessary (crosswise with respect to the first one) for the total removal of the defects related to heteroepitaxy, as described in detail in the above-mentioned French patent document No. 88 04438.

In the second case,, we are not confronted with the basic difficulties of heteroepitaxy. It is therefore possible to broadly follow the pattern of homoepitaxy explained in the French patent document No. 8804437 and briefly commented upon with reference to FIGS. 8 and 9.

Figure 1B:
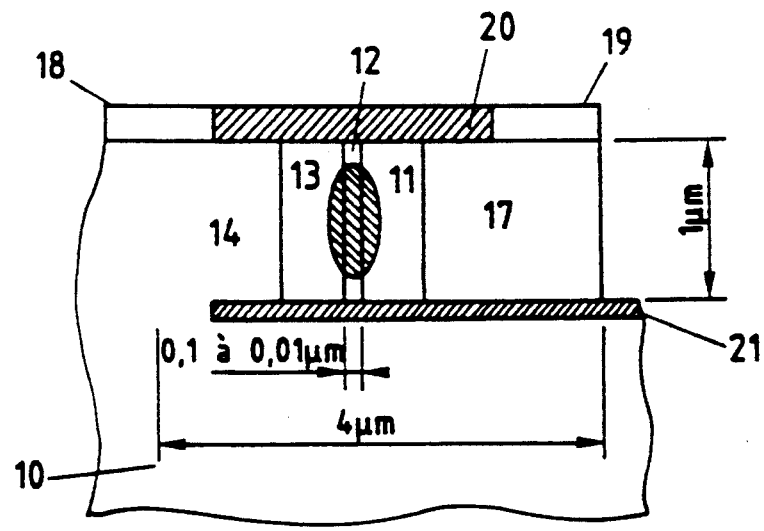
FIG. 1B represents a planar laser with the same composition, obtained according to the method of the invention.

To put it in concrete but non-restrictive terms, as a typical application to be made, we could take the lateral laser structure shown in FIG. 1B. To avoid complicating matters unnecessarily, we shall consider the simplest case, namely the case of a GaAs substrate. Of course, the method can be applied also in the case of a substrate Si provided that the above-mentioned necessary procedure to remove the defects in the active zone is followed.

As shown in FIG. 1B, the aim is to make a planar laser diode on a GaAs substrate 10 having, successively, the following layers (in the lateral direction):

p+GaAs (zone 14);
p $Ga_{0.7}Al_{0.3}As$ (zone 13);
p GaAs (active zone 12);
n $Ga_{0.7}Al_{0.3}As$ (zone 11);
n+ GaAs (zone 17).

The succession of zones extends, for example, over a thin layer with a thickness of 1 $\mu$m, and with a width of about 4 $\mu$m. The width of the active zone is, for example, 0.1 to 0.01 $\mu$m.

Several major advantages flow from this planar structure, with respect to the same "vertical" structure of FIG. 1A. Thus, the structure is completely plane, and the contact zones 18, 19 for the control of the device are on the surface of the wafer, as opposed to standard structures which have one contact on the front face of the wafer and a second contact on the rear face. The possibility of placing the two electrodes 18, 19 on the front face enormously facilitates integration, and enables the completely independent control of each laser on one and the same wafer. Furthermore, additional control electrodes (not shown) may be added on, for example on the active zone of the device, with an interposed dielectric layer.

In the GaAs industry, it is common practice to use several methods of vapor phase epitaxy (VPE) at atmospheric or reduced pressure, depending on the desired application. For the typical application considered herein, the most appropriate technique would be reduced pressure MOCVD (Metalorganic Chemical Vapor Epitaxy).

This technique is the one commonly used in the fabrication of heterojunction lasers while at the same time (and this is essential to the implementation of the invention) enabling the performance of selective epitaxy (see for example the article by K. KAMON and coll. in "Journal of Crystal Growth", 73, 1985, page 73). In a manner known to those skilled in the art, selective epitaxy consists in the epitaxy, on a substrate having monocrystalline zones of a given type A and zones having a different nature, of a monocrystalline material on the type A monocrystalline zones while, at the same time, getting rid of the deposit on the remaining zones. In order to obtain a selective epitaxy easily, it is also possible to use a VPE method, such as the method based on $AsCl_3$ and Ga, by incorporating an additional source of trimethyl aluminium for example (see, for example M. ERMAN and coll., SPIE Vol. 6511, Integrated optical Circuit Engineering III (1986) 75).

Schematically, the method for making the device considered herein shall now be described in detail in relation with FIGS. 5A to 5I:

Step 1: On a monocrystalline GaAs substrate 50, there is deposited, by cathode sputtering, a layer 51 of $Si_3N_4$ with a thickness ranging from some hundreds to some thousands of angstroms (from $10^{-8}$ to $10^{-7}$ m). This encapsulation layer will enable, if necessary, be an annealing step at a temperature of 800°-850° C. in an oxygen atmosphere for the densification of the deposited silica.

Step 2: In three steps, and by known means of low-temperature CVD, three successive layers of $SiO_2$, 52, amorphous silicon 53 and again $SiO_2$, 54, are made. The thicknesses of these three layers are all between some tenths of a micron and some microns. If necessary, the silica could be annealed after each deposition in an oxygen atmosphere at 800°-850° C.

Step 3: On the stratified structure thus obtained, there is spread a layer of photolithographic resin 55 with a thickness sufficient for reactive ion etching (RIE) which follows in the step 4. By photolithography, apertures are made in this layer. These apertures are in the form of parallel strips with a width ranging from some tenths of a micron to some microns, and have a periodic spacing ranging from ten microns to some hundreds of microns. The orientation of the strips is a function of the orientation of the substrate and is chosen so as to optimize the speed and faceting of the conformal and selective lateral epitaxy which is to follow.

Step 4: Using the resin mask 55, strips 56 are etched by RIE in the stratified structure of four subjacent layers 51, 52, 53, 54. The width of these strips 56 is defined by the mask. To prevent any damage to the substrate by the RIE attack, the last remaining hundreds of angstroms of silica 52 and of $Si_3N_4$ may be removed by aqueous chemical means. The resin mask 55 is removed either chemically or by oxygen plasma attack.

Step 5: By means of a chemical solution which selectively attacks the Si without affecting the silica, the width of the aperture 56 in the amorphous Si layer 53 is increased by some microns, so as to define lateral filling apertures 57.

Step 6: Under conditions of selective GaAs epitaxy (either by reduced pressure MOCVD or by VPE), we fill the previously defined apertures 56, 57 (FIG. 5D) with monocrystalline GaAs 58 so as to planarize the structure.

Figure 5A:
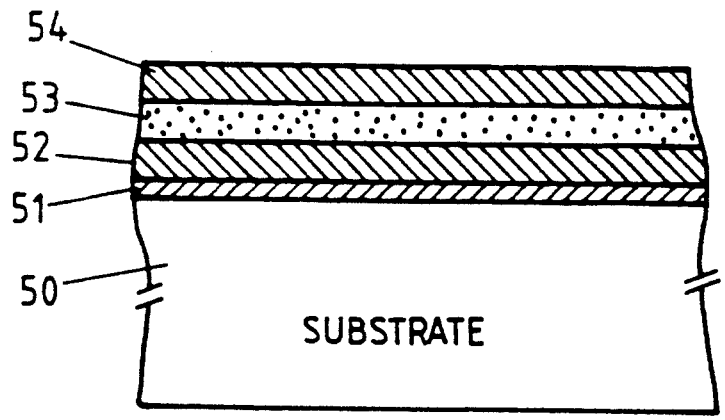
Figure 5B:
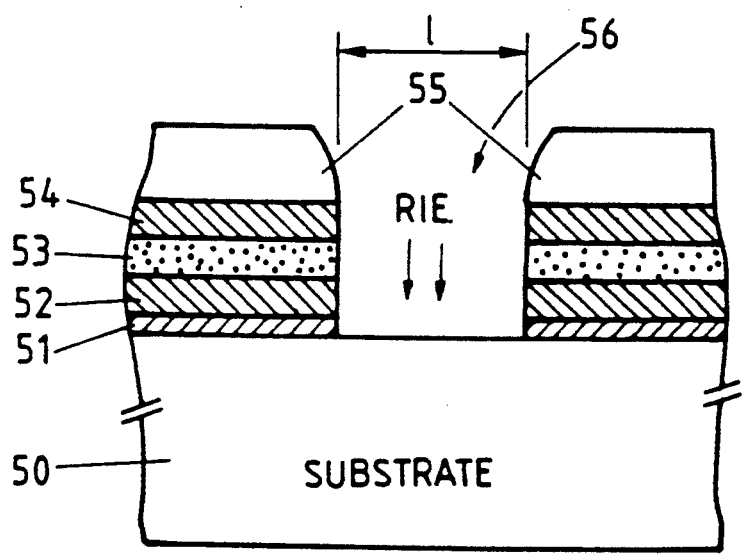
Figure 5C:
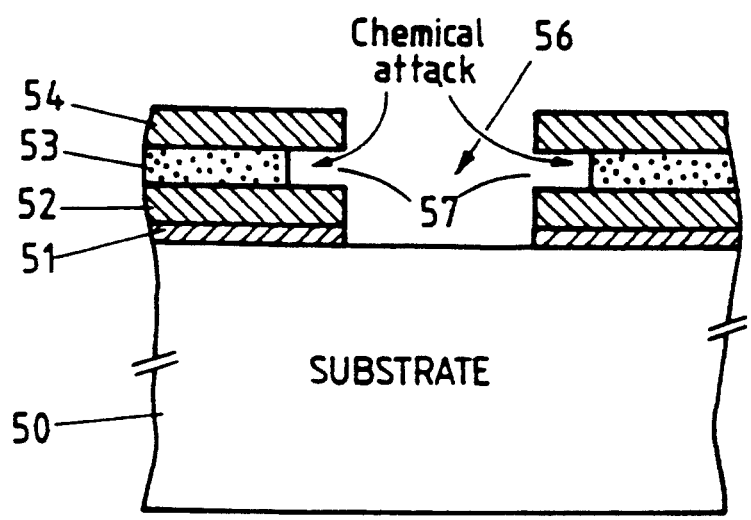
Figure 5D:
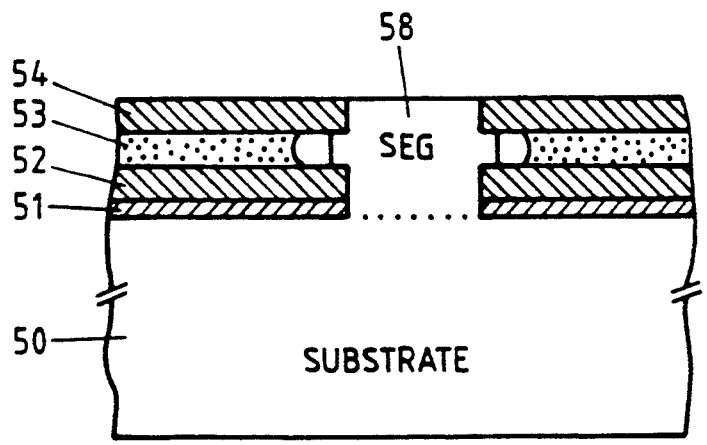
Figure 5E:
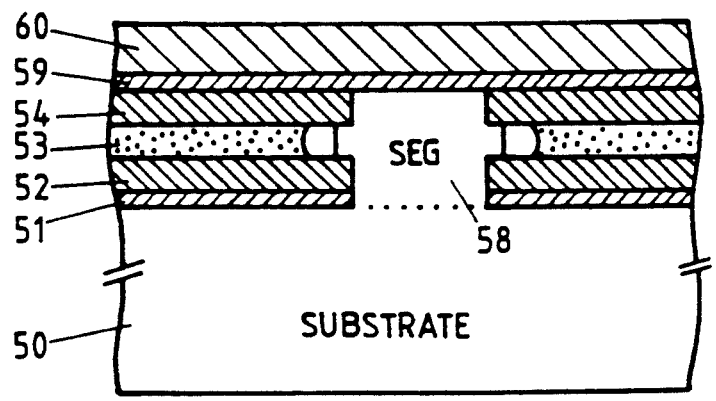

Step 7: Throughout the surface of the wafer, cathode sputtering is used to deposit a layer 59 of $Si_3N_4$ with a thickness of between some hundreds and some thousands of angstroms (FIG. 5E).

Step 8: Using a low-temperature CVD method, a silica layer 60 is deposited on the entire surface of the wafer. This silica layer 60 has a thickness ranging between some tenths of microns and some microns (FIG. 5E).

Figure 5F:
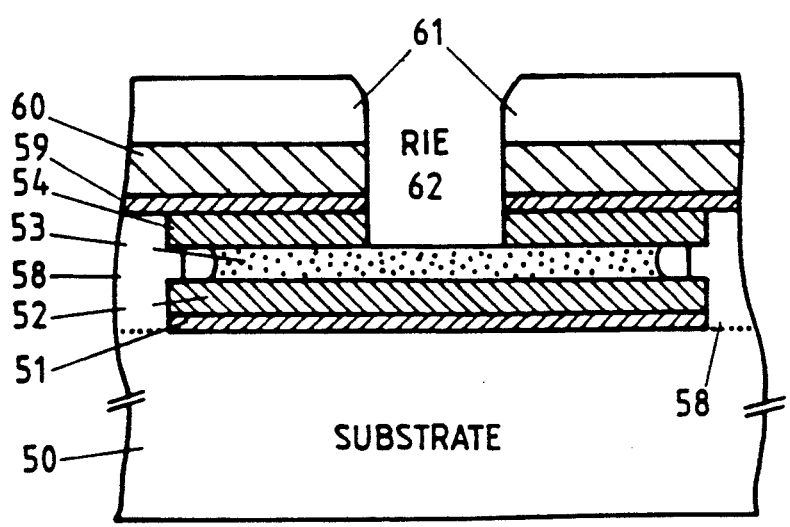

Step 9: By photolithography, a system of apertures 62 is defined in a resin layer 61 having a thickness sufficient for the attacking, by RIE, of the underlying silica layer 60. This system of apertures 62 is in the form of strips having a periodicity that is identical to that of the system 56, defined in the step 3 but offset with respect to it so as to be located at mid-distance between the strips 56 or 58 of the first system, and having a width ranging from some tenths of a micron to some microns (FIG. 5F).

Step 10: Using the resin mask 61, strips 62 are etched by RIE in the underlying silica layer 60 and $SI_3N_4$ layer 59. The width of these strips 62 is defined by the mask 61 (FIG. 5F).

Step 11: Using a chemical solution that selectively attacks Si without affecting silica, the underlying layer 53 of amorphous or polycrystalline silica is removed through the apertures 62 in the silica layer, thus baring the monocrystalline GaAs regions 58 which will be used as a seed for the next step (FIG. 5G).

Step 12: Under conditions of selective epitaxy, an "conformal" lateral growth of p+ doped GaAs 63 is made from the seed 58 (using zinc dimethyl, for example, as the dopant). The extension of this growth may be from some microns to some tens of microns.

Step 13: Again under conditions of selective epitaxy, but with the addition of an Al carrier gas (trimethyl aluminium for example) with the appropriate concentration, a section 64 of p doped $Ga_{0.7}Al_{0.3}As$ is added (using dimethyl zinc, for example, as the dopant) with a width of $10^{-2}$ to some $10^{-1}$ microns.

Steps 14 and 15: By adjusting the proportions of the carrier gases and of the dopants as in the step 13, we add two more sections by conformal epitaxy, one layer 65 of p type GaAs and one layer 66 of n type $Ga_{0.7}Al_{013}As$, each having a width of 10 microns to some 10 microns.

Step 16: By conformal epitaxy, a final layer 67 of n+ doped GaAs is added. This final layer 67 has a width of some microns to some tens of microns (see FIG. 5H for the steps 12, 13, 14, 15 and 16).

Step 17: Using photolithography and chemical etching or RIE, a part of the dielectric layer 54 on the p+ GaAs and n+ GaAs zones is removed to take the metal contacts 68 for the control of the laser (see FIG. 5I).

Step 18: If necessary, the active region 65 of the laser may be isolated from the seeding zone by chemical etching or by RIE. Finally, in order to define the laser cavity in the longitudinal direction, a process of anisotropic chemical attack will be used so as to form semi-reflective walls that make an angle of 90° with the plane of the substrate (see, for example, the article by Y. TARNI and coll.in "Journal of the Electrochemical Society, Vol. 118, No. 1, p. 118, 1971).

The method described herein concerns the making of a set of identical devices, periodically arranged on a semiconductor substrate. These devices, after being cut out, can be used as discrete components. Quite clearly, there is nothing to prevent such devices from being made individually, at well-defined places on the surface of a chip so as to form part of an integrated circuit.

LATERAL MODULATION OF THE DOPING

This mode of preparation according to the method of the invention may be applied with practically all the semiconductors used today in the micro-electronics industry.

As in the case of the lateral modulation of the composition of semiconductors, it relies essentially on the conformal lateral epitaxy method (above-mentioned French patent document No. 8804437). In this method, an major place is taken by the selective epitaxy of semiconductors which can be done, depending on the materials involved, by one of the standard methods of epitaxy. Examples of these standard methods are:

CVD for silicon (see, for example, L. Jastrzebski et al in J. Vac. Scie. Technol., 130, 1571 (1983), and L. Karapiperis et al in Proceedings, MRS Symposium, Boston, Dec. 1987);

MOCVD for the III-V compounds (see, for example, R. P. Gale et al in Appl. Phys. Lett., 41, 545 (1982), and K. Yamaguchi et al in ipn. J. Appl. Phys., 24 (12) 1666 (1985);

the VPE method using chlorides (according to the $AsCl_3$- $GaAs$-$H_2$ process), also for the III-V compounds (See, for example, C. O. Bozler et al in J. Vac. Sci. Technol. 20 (3), 720 (1982) and N. Vodjani et al in J. Crys. Growth, 71, 141 (1985)).

Furthermore, the method proposed herein for the modulation of lateral doping can also benefit from all the basic advantages of lateral epitaxy, notably the removal, in the thin layers, of the defects caused during the heteroepitaxy of two different semiconductors (the above-mentioned French patent document No.

8804438). This is the case, notably, if it is desired to make an active layer of GaAs on the Si substrate.

When the active zones in the layer made by conformal lateral epitaxy calls for a uniform doping, this can be done,, quite clearly, by standard implanatation or thermal diffusion of the dopants. These two methods necessarily imply at least one masking level, if only one type of dopant is involved and, in the case of ion implantation, an additional thermal annealing step is needed to cure the induced defects and activate the dopants. The method of the invention described herein makes it potentially possible, even in the case of uniform doping, to simplify the process through the doping, on site, during the epitaxial growth of the active layer, thus getting doing away with at least one masking step. An additional simplification, with respect to the ion implantation, lies in eliminating the thermal annealing step of activation: this is not necessary in the case of the doping performed during the epitaxy. The method of the invention is especially valuable for GaAs which, by virtue of its fragility, does not always stand up very well to ion implantation (it is subject to the creation of defects that are hard to cure), or to the activation annealing which, furthermore, calls for a prior encapsulation of the surface ($Si_3N_4$ or $SiO_2$).

The typical semiconductor that shall be considered herein will be GaAs for the active zone of the device and for the substrate without, however, this being possibly taken to be a restriction on the scope of the invention. By way of an example, herein, we shall describe the making of a Schottky type varicap diode with hyperabrupt profile, or with linear or any slope, and with planar structure, of the type shown schematically in FIG. 3.

Varicap diodes have many applications such as the electronic tuning of oscillators, the detection, mixing or harmonic generation of signals. Their chief characteristic is that their capacitance varies inversely to the bias voltage V that is applied to them, according to the expression:

$$C = A (V + \phi - V_n)^{-k}$$

wherein

A is a constant, $\phi$ is the height of the Schottky barrier, $V_n$ is the position of the Fermi level counted in absolute value from the bottom of the conduction band.

$k = 1/(m+2)$ where m is the parameter defining the variation in doping n as a function of the distance d, with respect to the area according to: $n = f(d^m)$.

The capacitance of a varicap diode is therefore related to the parameter m, for a given bias voltage.

Figure 2:
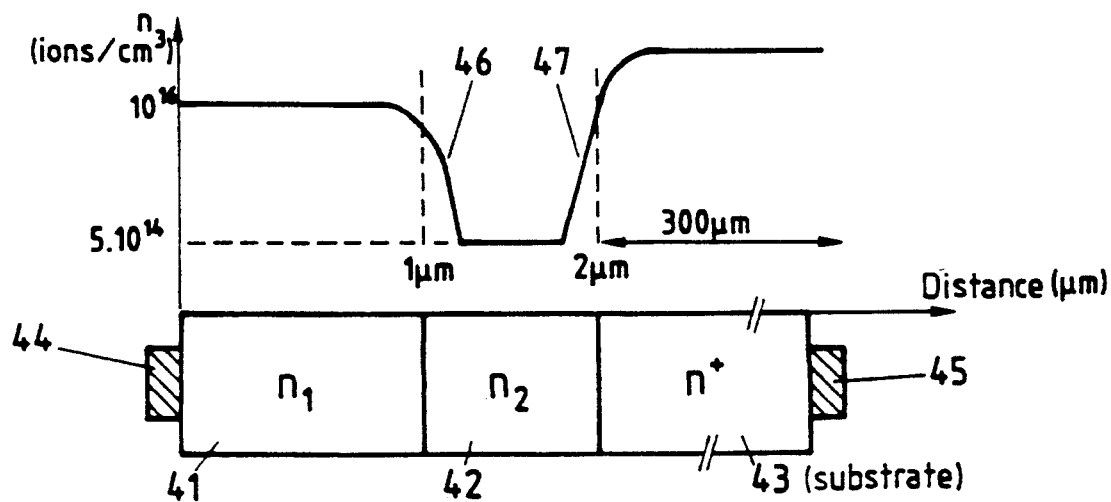
FIG. 2 shows the structure and the doping profile of a hyperabrupt plane varicap diode with laterally graduated doping profile, obtained according to the prior art.

Prior art diodes of this type are made by standard methods of epitaxy and, consequently, have a "vertical" structure. According to the prior art, a diode with linear slope is made as follows: on a substrate 43 with high n+ doping at $10^{18}$ ions/cm$^3$, two layers 42 and 41 of semiconductor material (FIG. 2) are deposited by epitaxy. The layer 41 is n doped at $10^{16}$ ions/cm$^3$. The layer 42 is a transition region symbolized by a $\Delta n$. In the simplest case, it is given uniform n doping at a level of the order of $5 \times 10^{14}$, so as to make two "hyperabrupt" transitions 46, 47 at the interface with the layers 41 and the substrate 43. Two electrodes 45 are designed for the control of the device. It is quite clear that this method of preparation, in affecting the entire surface of the wafer at each step, is well suited to making discrete devices but is not at all suited to the making of devices such as this within an integrated circuit.

Figure 3:
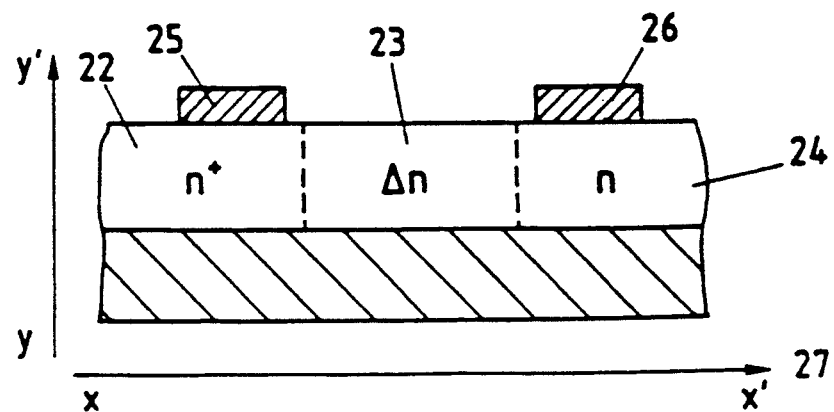
FIG. 3 shows the structure of a varicap Schottky diode, with hyperabrupt profile, made by planar technology according to the method of the invention.
Figure 4A:
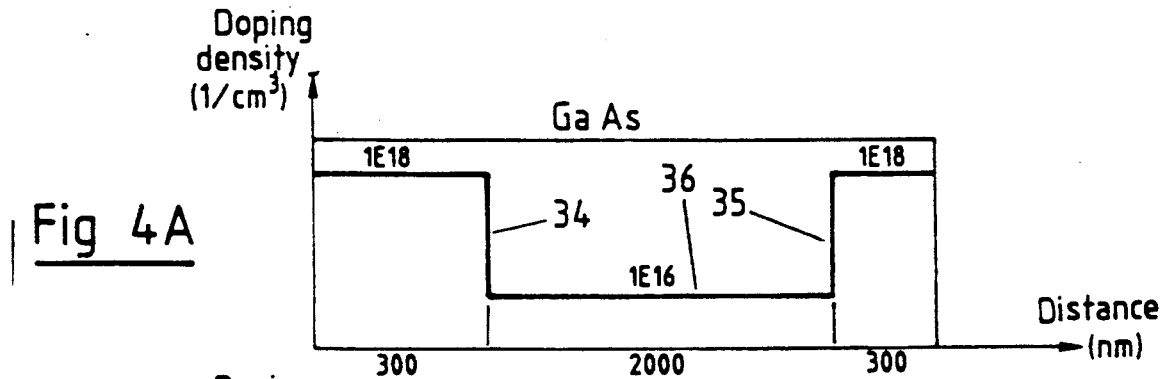
FIG. 4A shows the doping profile of a known Gunn diode with heterojunction cathode and FIGS. 4B and 4C respectively show the doping profile and the composition profile (mole fraction of aluminium) of a Gunn diode with variable profiles, that can be made in a planar way according to the method of the invention.
Figure 4B:
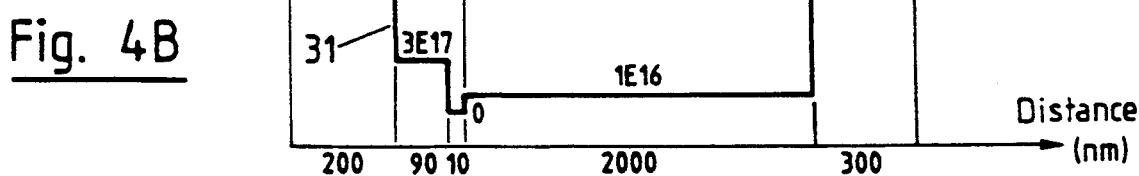
Figure 4C:
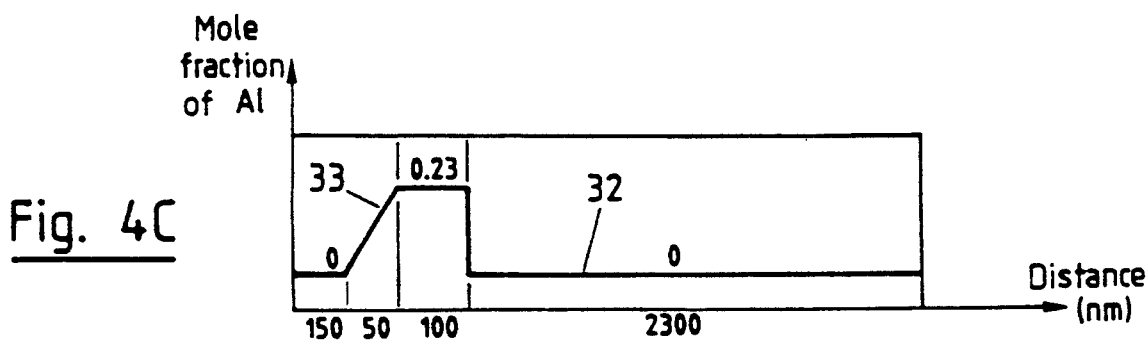

The solution provided by the invention is shown schematically in FIG. 3. The device, having a "lateral" and plane structure, can be made by the method of selectively conformal lateral epitaxy in the desired zones of an integrated circuit. Thus, we distinguish the 3 zones, n+ (22), n (23) and n (24), that succeed one another in the direction xx' parallel to the surface of the substrate 27. The control electrodes 25, 26 are positioned on the surface of the thin layer 22, 23, 24. This greatly facilitates the integration of the device into a complex circuit. Quite clearly, nothing prevents the use of the method described herein for the making of devices with variable doping profile and planar structure in the form of discrete components. It must be noted that the method of conformal lateral epitaxy enables the making of abrupt lateral doping transitions on a width close to about a hundred angstroms ($10^{-8}$ m). The doping level may be modulated in a controlled way in the lateral direction (direction xx'), but it remains uniform in the plane of the growth front (YY') (FIG. 3).

Figure 6A:
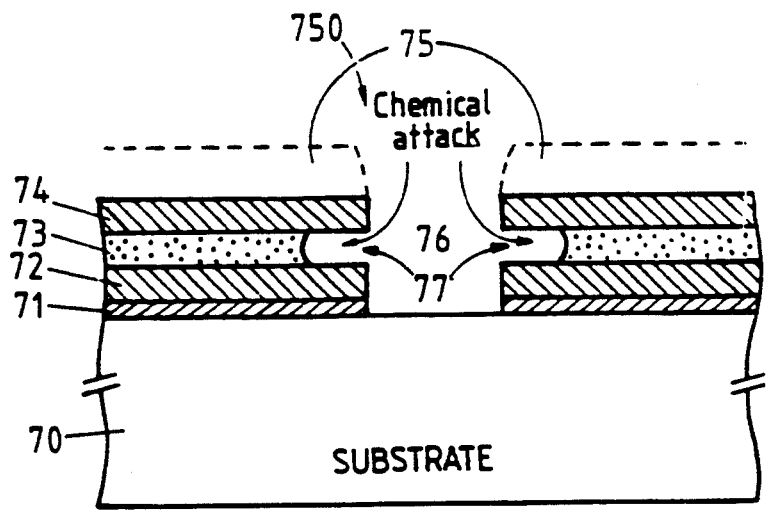
FIGS. 6A to 6C represent the characteristic steps of a mode of implementation of the method of the invention for making a planar Schottky diode of the type shown in FIG. 2.
Figure 6B:
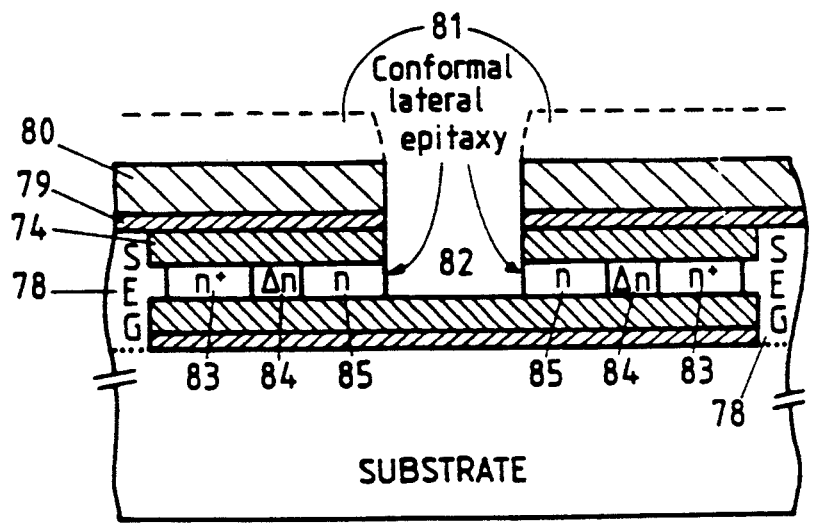
Figure 6C:
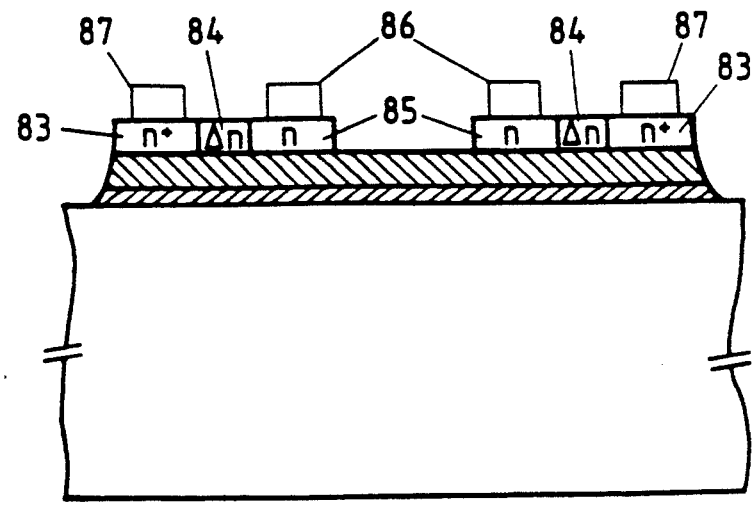

The method described below in relation with FIGS. 6A to 6C concerns the making of identical devices, periodically arranged in pairs on the surface of the semiconductor substrate. It will be noted that the steps 1 to 4 and 6 to 11 are not the object of a specific FIGURE, because of the similarity between the way in which this stage of the method takes place and what was described earlier in relation to the FIGS. 5A to 5I.

Step 1: On a monocrystalline GaAs substrate 70, there is deposited, by cathode sputtering, a layer 71 of $Si_3N_4$ with a thickness ranging from some hundreds to some thousands of angstroms (from $10^{-8}$ to $10^{-7}$ m). This encapsulation layer will enable, if necessary, an annealing step at a temperature of 800°-850° C. in an oxygen atmosphere for the densification of the deposited silica (Step 2b).

Step 2: In three steps, and by known means of low-temperature CVD, three successive layers of $SiO_2$, 72, amorphous silicon 73 and again $SiO_2$, 74, are made. The thicknesses of these layers are all between some tenths of a micron and some microns.

Step 2b: If necessary, annealing at 800°-850° C. in an oxygen atmosphere to densify the silica.

Step 3: On the stratified structure thus obtained, there is spread a layer of photolithographic resin 75 with a thickness sufficient for the reactive ion etching (RIE) which follows in the step 4. By photolithography, apertures 750 are made in this layer. These apertures are in the form of parallel strips with a width ranging from some tenths of a micron to some microns, and have a periodic spacing ranging from ten to some hundreds of microns. The orientation of the strips is a function of the orientation of the substrate and is chosen so as to optimize the speed and faceting of the conformal, lateral epitaxy which is to follow.

Step 4: Using the resin mask, strips 76 are etched by RIE in the stratified structure of four subjacent layers 71, 72, 73, 74. The width of these strips 76 is defined by the mask. To prevent any damage to the substrate by the RIE attack, the remaining last hundreds of angstroms of silica 72 and of $Si_3N_4$ 71 can be removed by aqueous chemical means. The resin mask 75 can be removed either chemically or by oxygen plasma attack.

Step 5: By means of a chemical solution which selectively attacks Si without affecting the silica, the width of the aperture 76 in the amorphous Si layer is increased by some microns, so as to define lateral filling apertures 77 (FIG. 6A).

Step 6: Under conditions of selective GaAs epitaxy (either by reduced pressure MOCVD or by VPE), the previously defined apertures 76, 77 are filled with monocrystalline GaAs 78 so as to planarize the structure.

Step 7: Throughout the surface of the wafer, cathode sputtering is used to deposit a layer 79 of $Si_3N_4$ with a thickness ranging from some hundreds to some thousands of angstroms ($10^{-8}$ to $10^{-7}$ m).

Step 8: Using a low-temperature CVD method, a deposition is made throughout the surface of the wafer of a silica layer 80 with a thickness ranging from some tenths of a micron to some microns.

Step 9: By photolithography, a system of apertures 810 is defined in a resin layer 81 having a thickness sufficient for the attacking, by RIE, of the underlying silica layer 80. This system of apertures 810 is in the form of strips having a periodicity that is identical to that of the system defined in the step 3 but is offset with respect to it so as to be located at mid-distance between the strips of the first system, and having a width ranging from some tenths of a micron to some microns.

Step 10: Using the resin mask 81, strips 82 are etched by RIE in the underlying silica layer 80 and $SI_3N_4$ layer 79. The width of these strips 82 is defined by the mask 81.

Step 11: Using a chemical solution that selectively attacks the Si without affecting the silica, the underlying layer 73 of amorphous or polycrystalline silica is removed through the apertures in the silica layer, thus baring the monocrystalline GaAs regions 78 which will act as a seed for the next step (not shown).

Step 12: Under conditions of selective epitaxy and using seeds 78 bared in the previous step, an "conformal" lateral epitaxy of n+ type GaAs 83 is made on a width ranging from some microns to some tens of microns in the empty space left by the removal of the layer 73 of amorphous or polycrystalline SI. The n type doping may be obtained by the addition of $SiH_4$ in the vapor phase.

Step 13: By a sudden reduction in the concentration of the n type dopant (namely the partial pressure of $SiH_4$ in the gas phase) to make an abrupt transition, the conformal lateral epitaxy is continued by modulating the concentration of the dopant (hence the partial pressure of $SiH_4$) so as to create the desired profile in the n zone (84). The width of this zone 84 may vary between some tenths of a micron and several microns.

Step 14: The n doping level is increased suddenly to obtain, again by conformal lateral epitaxy, a zone 85 with n type doping to $10^{16}$ ions/cm$^3$ (see FIG. 6B).

Step 15: Using a standard etching method, each device of the substrate may be totally isolated.

Step 16: By the deposition of metals such as Ti, Au etc. . . . , two Schottky diodes 86, 87 per device are made according to the prior art. This completes the fabrication of the device.

FIGS. 7A to 7F illustrate a variant replacing the steps 1 to 11 for both modes of carrying out the method of the invention, described further above in relation to FIGS. 5A to 5I and 6A to 6C. This variant corresponds to an implementation of the mode of preparing the lateral confinement cavities 830, 831, 832 described further above with respect to FIGS. 8A to 8D.

In this variant, the process of making each cavity can be expressed schematically by saying that it consists in provoking the selective growth of at least one crystal seeding pad (94) on the surface of a crystalline substrate (91), in depositing a stratified dielectric (96)/temporary layer (95)/dielectric (96) structure on said surface provided with the pad or pads (94) in such a way that the upper dielectric level (96) of the stratified structure lies approximately at the level of the upper part of said pad or pads (94), and in removing said temporary layer (95) from the stratified structure through at least one aperture (98) made in the stratified structure until said crystal pad (94) is reached.

Figure 7A:
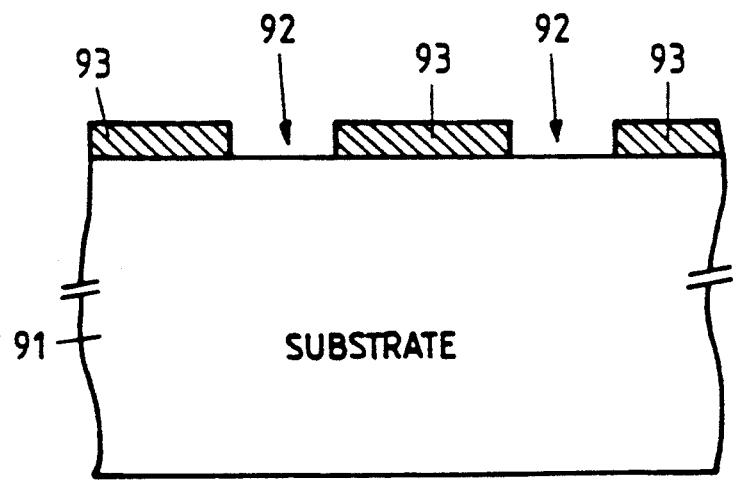
FIGS. 7A to 7F give a schematic view of the successive steps of a variant of implementation of the steps 1 to 11 for the making of the planar GaAs laser diode of of FIG. 1A, or of the Schottky diode of FIG. 2.

Step 1: We start with a monocrystalline substrate 91 of semi-insulating GaAs having bare zones 92, in the form of strips with a width ranging from one micron to some microns and a length ranging from some tens of microns to some centimeters, separated by zones 93 covered with a layer of dielectric such as silica ($SiO_2$) or silicon nitride ($Si_3N_4$), with a width of ten microns to some hundreds of microns. The thickness of this layer 93 ranges from $10^2$ microns to some microns. The orientation of the strips is a function of the orientation of the substrate and is chosen so as to optimize the speed and faceting of the conformal lateral epitaxy which is to follow (FIG. 7A).

Figure 7B:
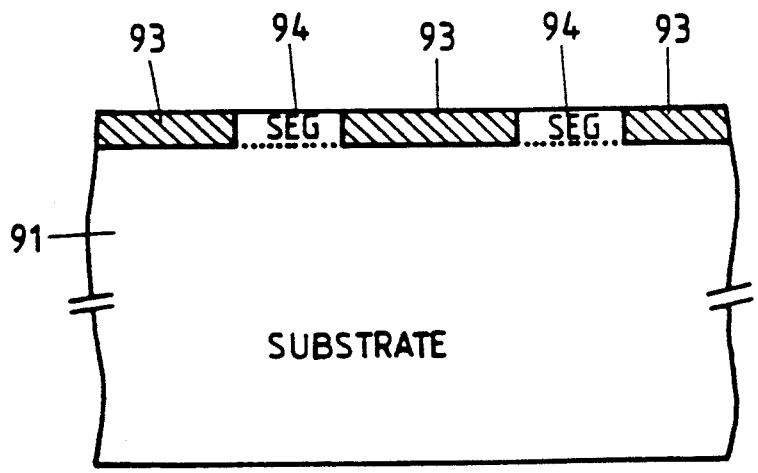

Step 2: Under conditions of selectivity, a selective epitaxial growth (SEG) of semi-insulating GaAs 94 is done in the bare zones 92 (seeding zones) so as to planarize the structure (FIG. 7B).

Figure 7C:
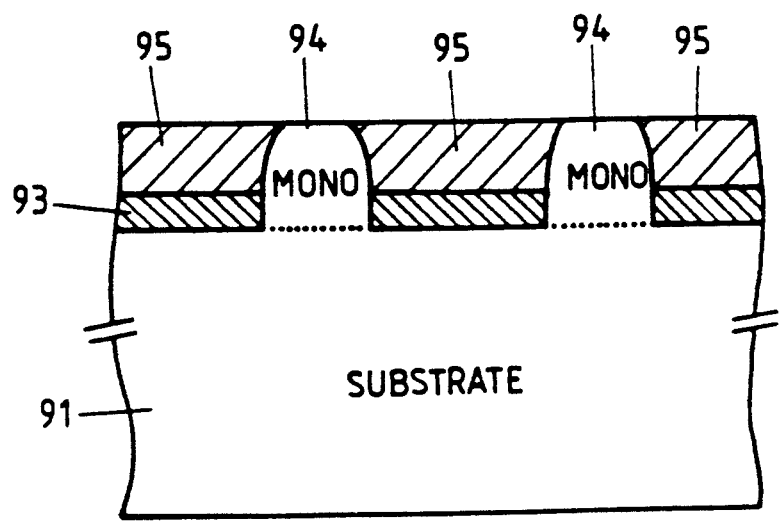

Step 3: Then, with the deposition temperature and the concentration of Ga and As carrier gases being changed, at the same time, an epitaxy is done in the monocrystalline zones 94, and a polycrystalline deposition with the same thickness is done on the insulator 93. The steps 2 and 3 may be done in sequence, without taking the sample from the reactor (FIG. 7C).

As a variant, this step could be done in an MBE (molecular beam epitaxy) reactor.

Figure 7D:
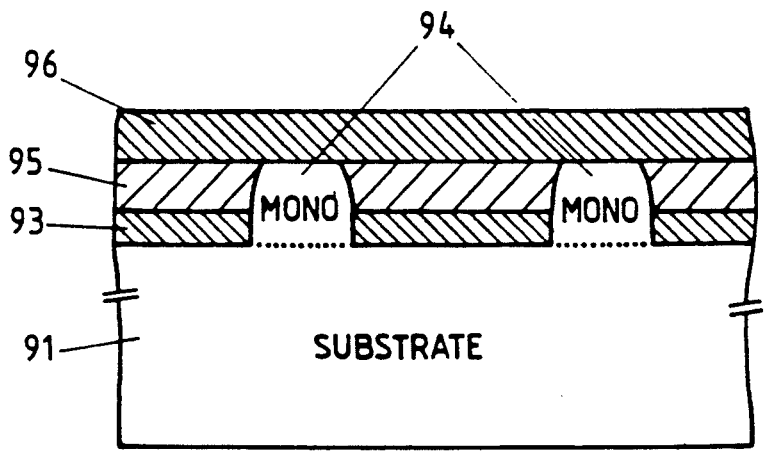

Step 4: Using a low-temperature CVD method, a layer of dielectric 96 ($SiO_2$ or $Si_3N_4$) is deposited, with a thickness of $10^{-2}$ $\mu$m to some microns (FIG. 7D).

Figure 7E:
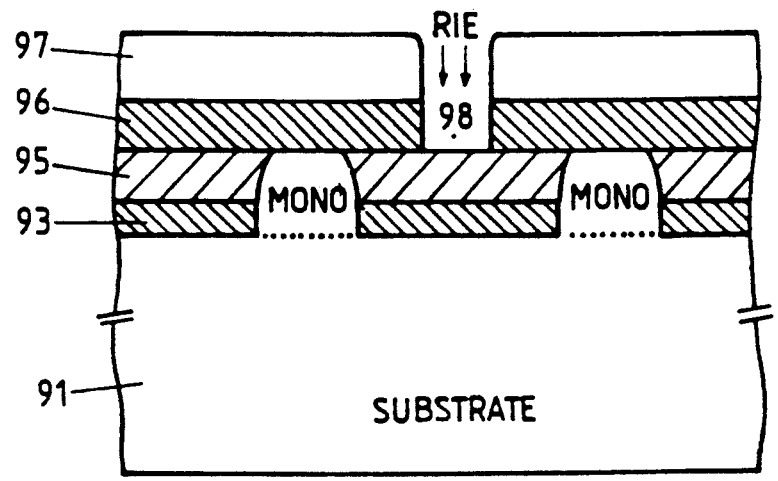

Step 5: Using a photolithographic method, a system of apertures is made in a resin layer 97. This system of apertures has a thickness ranging from 0.5 $\mu$m to some microns, and is in the form of strips that are parallel to the seeding strips and have a same periodicity but are offset from the seeding strips so as to be located at mid-distance between the seeding zones. The width of the apertures in the resin ranges from 0.5 $\mu$m to some microns (FIG. 7E).

Step 6: Using the mask resin 97, the apertures 98 are etched by an RIE (reactive ion etching) method in the dielectric layer through the apertures of the resin, up to the underlying layer 95 of polycrystalline GaAs (FIG. 7E).

Figure 7F:
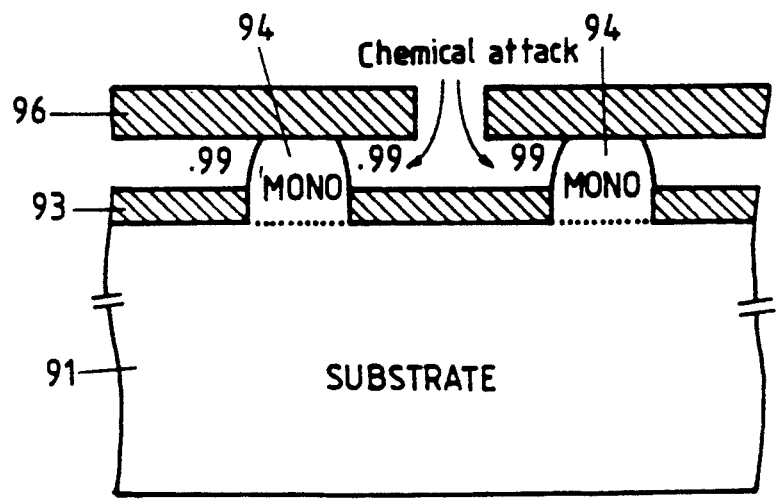
Figure 8A:
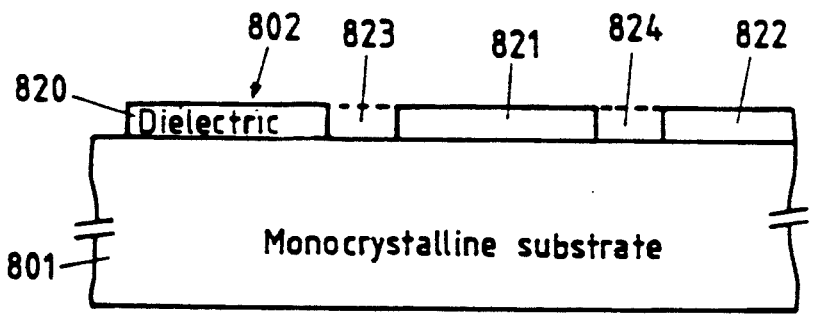
FIGS. 8A to 8D summarize the main steps of the implementation of method for making the confinement cavities for an operation of directed epitaxial growth, such as the one described in in the patent document No. 804437.
Figure 8B:
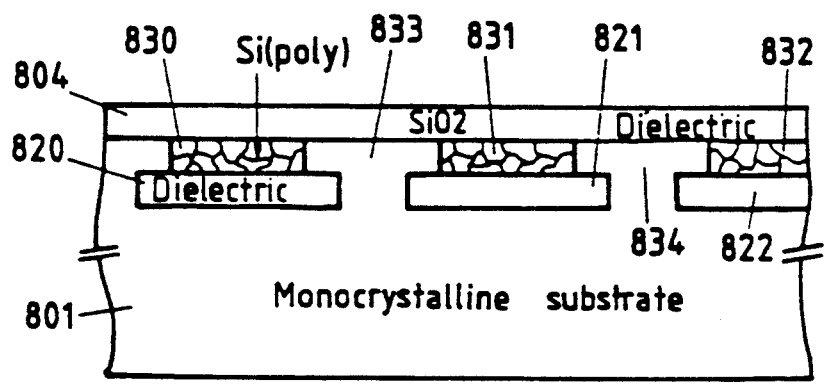
Figure 8C:
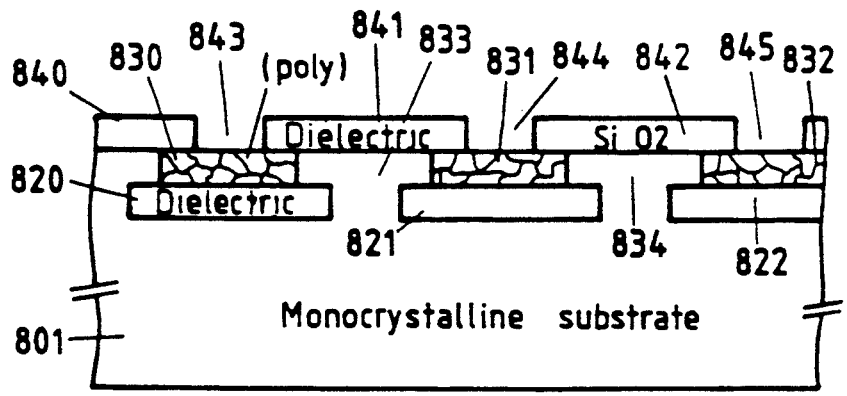
Figure 8D:
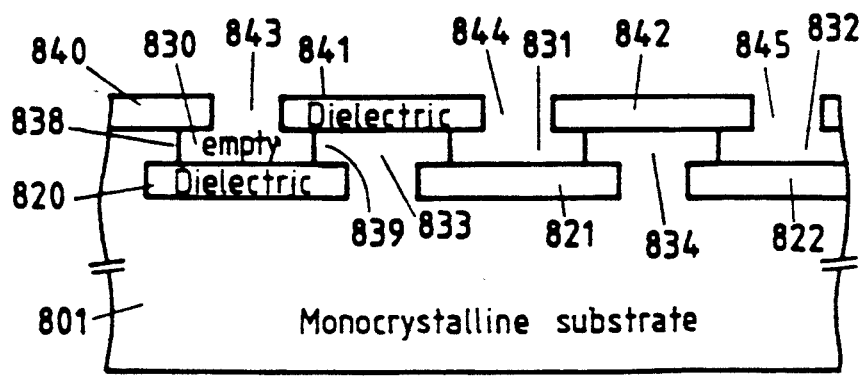

Step 7: Using a solution that selectively attacks the polycrystalline GaAs 95 without attacking the dielectrics 95, 96, the polycrystalline GaAs 95 is attacked until the monocrystalline seed 94 is bared (FIG. 7F). We thus return to the case of FIGS. 5-G and 6-A described above.

The cavities 99 then act as confinement cavities for the stage of monocrystalline growth with modulation of doping and/or of composition according to the invention, using the seeds 94. Yet other variants are possible, on the basis of the cases described in the above-mentioned French patent documents Nos. 88 04437 and 88 04438.

Generally, the invention also concerns any discrete or integrated electronic component with laser emission, formed by the substantially horizontal juxtaposition, on a substrate, of an active junction between two confinement layers.

It also concerns any GUNN type, discrete or integrated component, formed by the substantially horizontal juxtaposition, on a substrate, of a semiconductor transition zone with laterally modulated doping between two fixed doping zones.

In these components, according to the invention, the control electrodes are advantageously positioned so as to be coplanar with the surface of appropriate contact layers.

What is claimed is:

1. A method for fabrication of a thin monocrystalline layer of a semiconducting material, through growth by gas phase deposition, comprising:
   a first step of growing the semiconducting material from a seed crystal,
   wherein said crystal growth is confined within a space located between opposing confining surfaces of two substantially horizontal confinement layers,
   wherein each confinement layer is made of materials that are different from the semiconducting materials of the thin monocrystalline layer so that nucleation or deposition of the semiconducting material onto exposed surfaces of either of the two confinement layers does not occur,
   wherein growth during the first step occurs along a substantially vertical direction toward one of said confinement layers,
   wherein the space between the two confinement layers defines the thickness of the thin monocrystalline layer; then
   a second step of growth along a substantially horizontal direction, wherein the second step further comprises varying the gas mixture in the gas phase to thereby modulate at least one of the composition and the doping of the thin monocrystalline layer along a substantially horizontal direction; and
   whereby the thin monocrystalline layer is formed with a modulation of one of the composition or doping along a direction which is parallel to the confining surfaces of the confinement layers.

2. A method according to claim 1 wherein the first step of growing the semiconductor material upon the seed crystal is heteroepitaxial growth upon the seed crystal.

3. A method according to claim 1, wherein growth during the first step occurs along a substantially vertical direction toward a first one of the confinement layers, thereby blocking vertically propagating defects.

4. A method for making a thin layer of at least one single crystal semiconductor material by gas phase deposition comprising the steps of:
   forming a structure comprising a seed crystal with a planar horizontal crystal first surface, said first surface confined by and connected to essentially vertical parallel lower portions of first and second dielectric wall means, the lower portions of the first and second wall means are connected to upper portions of said first and second wall means, respectively, said upper portions are flat, horizontal, and opposed to one another, thereby providing a channel between the first and second wall means in the shape of an inverted "L", said crystal first surface facing and opposed to an opposing region of said upper portion of said first wall means;
   growing a first epitaxial crystal vertically upon said planar horizontal crystal first surface toward said opposing region of said upper portion of said first wall means, thereby blocking defects growing vertically and providing a single crystal second surface in a lateral cavity defined by the horizontal upper portions of said first and second wall means; and
   growing a second epitaxial crystal horizontally on said single crystal second surface by conformal selective epitaxy, whereby said second epitaxial crystal grows without defects.

5. A method, according to claim 4, wherein said lower portions of first and second dielectric wall means have horizontal lower surfaces connected to said seed crystal.

6. A method according to claim 4, further comprising the steps of modulating the composition and doping of said second epitaxial crystal by varying the gas mixture in said gas phase.

7. A method according to claim 6 for the making of a thin layer formed by at least two distinct monocrystalline semiconductor materials wherein the modulation of the composition of said layer is obtained by the controlled and checked modification, in said gas mixture, of the partial pressure and/or of the mole fraction of the useful gases used to create the solid deposition of monocrystalline semiconductor materials.

8. A method according to claim 7, wherein metal control contacts of components obtained after growth are positioned on the upper face of the thin layer made by conformal epitaxy.

9. A method according to claim 6 for the making of a thin layer formed by at least one monocrystalline semiconductor material with modulation of the doping in said layer, wherein said modulation is controlled by variation in said gas mixture of the partial pressure and/or the mole fraction of the dopant gases.

10. A method according to claim 6, wherein: the step of growing a second epitaxial crystal comprises epitaxially depositing by an epitaxial deposition technique which is a member of the group consisting of CVD, MOCVD and chloride based VPE.

11. A method according to claim 6, wherein:
   said lateral cavity comprising a dielectric structure comprising a temporary dielectric layer deposited on a monocrystalline substrate.

12. A method according to claim 11, wherein the process for making said lateral cavity consists in providing, in a first stage, for the growth, from a substrate, of a monocrystalline seed in at least one first aperture made in the stratified structure and in achieving, in a second stage, the removal of the temporary layer from the stratified structure through at least one second aperture made in the stratified structure until it reaches said crystalline seed filling said first aperture.

13. A method according to claim 12, wherein said apertures made in the stratified structure are made by reactive ion etching (RIE).

14. A method according to claim 12, wherein a plurality of monocrystalline seeds and monocrystalline pads, respectively, are made on one and the same substrate, two adjacent seeds and monocrystalline pads being spaced out at a distance with a value ranging from 10 $\mu$m to some hundreds of microns approximately.

15. A method according to claim 11, wherein the process for making said lateral cavity consists in causing the selective growth of at least one crystalline seeding pad on the surface of a crystalline substrate, in depositing a stratified dielectric/temporary layer/dielectric structure on said surface provided with the pad or pads so that the upper dielectric layer of the stratified structure lies approximately at the level of the upper part of said pad or pads and in removing said temporary layer of the stratified structure through at least one aperture made in the stratified structure until said crystalline pad is reached.

16. A method according to claim 11, wherein said temporary layer of the stratified structure is made of polycrystalline or amorphous silicon, and wherein said step for the removal of the temporary layer consists of a chemical attack.

17. A method according to claim 11, wherein said dielectric layers of the stratified structure are formed by at least one of $SiO_2$ and/or $Si_3N_4$.

18. A method according to claim 11, wherein said temporary layer is made of $SiO_2$.

19. A method according to claim 6, wherein said conformal epitaxy is initiated on a monocrystalline seed in the region confined by said lower portions of first and second dielectric wall means.

20. A method according to claim 19, wherein said temporary layer comprises polycrystalline material which has the same composition as a monocrystalline seed.

21. A method according to claim 6, wherein said conformal epitaxial growth is done in a confinement cavity including a defect trap zone by the modification of the direction of epitaxial growth.

22. A method according to claim 6 for making a planar structured direct gap semiconductor laser diode, wherein a technique of directed selective epitaxy in vapor phase is used for the lateral growth of the zones of the laser diode, preferably a reduced pressure MOCVD technique.

23. A method according to claim 6 for making a Schottky varicap planar diode with hyperabrupt profile, wherein a technique of directed selective epitaxy in vapor phase is used for the lateral growth of the zones of the Schottky diode.

24. A method according to claim 6 for making a Gunn diode with heterojunction cathode, wherein a technique of directed selective epitaxy in vapor phase is used for the lateral growth of the zones representing the composition and doping profiles of the Gunn diode.

25. A method according to claim 4, wherein said wall means are resistant to deposition and nucleation of semiconductor material.

26. A method according to claim 4, further comprising the step of modulating the composition or doping of said second epitaxial crystal by varying the gas mixture in said gas phase.

27. A method according to claim 4, further comprising the step of modulating the composition of said second epitaxial crystal by varying the gas mixture in said gas phase.

28. A method according to claim 4, further comprising the step of modulating the doping of said second epitaxial crystal by varying the gas mixture in said gas phase.

29. A method according to claim 4, wherein the step of forming said structure comprising a seed crystal further comprises the steps of:
    forming a first insulating layer on a semiconductor substrate;
    etching a first aperture in said first insulating layer to expose a first substrate region of the substrate;
    depositing a semiconductor layer over the insulating layer and the first substrate region, said semiconductor layer comprising a monocrystalline region directly above said first substrate region and a polycrystalline region directly above said insulating layer;
    depositing a second insulating layer upon said semiconductor layer;
    forming an aperture in the second insulating layer which extends to a polycrystalline region of the semiconducting layer; and
    selectively etching the polycrystalline semiconductor material exposed by the aperture thereby removing the exposed polycrystalline material.

30. A method according to claim 4 wherein growth of the first epitaxial crystal on the planar horizontal crystal first surface is heteroepitaxial growth.

* * * * *